United States Patent
Hussein

(10) Patent No.: US 11,474,441 B2
(45) Date of Patent: Oct. 18, 2022

(54) SYSTEMS AND METHODS FOR GENERATING DROP PATTERNS

(71) Applicant: CANON KABUSHIKI KAISHA, Tokyo (JP)

(72) Inventor: Ahmed M. Hussein, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 61 days.

(21) Appl. No.: 16/912,495

(22) Filed: Jun. 25, 2020

(65) Prior Publication Data

US 2021/0405547 A1     Dec. 30, 2021

(51) Int. Cl.
| | |
|---|---|
| G03F 9/00 | (2006.01) |
| G03F 7/00 | (2006.01) |
| B29C 59/02 | (2006.01) |
| B82Y 10/00 | (2011.01) |
| B82Y 40/00 | (2011.01) |

(52) U.S. Cl.
CPC .......... *G03F 9/7042* (2013.01); *B29C 59/022* (2013.01); *B82Y 10/00* (2013.01); *B82Y 40/00* (2013.01); *G03F 7/0002* (2013.01); *B29C 2059/023* (2013.01)

(58) Field of Classification Search
None
See application file for complete search history.

(56) References Cited

U.S. PATENT DOCUMENTS

| | | | |
|---|---|---|---|
| 6,936,194 B2 | 8/2005 | Watts | |
| 8,066,930 B2 | 11/2011 | Sreenivasan et al. | |
| 8,119,052 B2 | 2/2012 | Schumaker | |
| 8,349,241 B2 | 1/2013 | Sreenivasan et al. | |
| 8,586,126 B2 | 11/2013 | Schumaker | |
| 9,651,860 B2 | 5/2017 | Aihara | |
| 9,651,862 B2 | 5/2017 | Fletcher et al. | |
| 9,804,503 B2 | 10/2017 | Tanaka | |
| 10,029,456 B2 | 7/2018 | Nakagawa et al. | |
| 10,192,793 B2 | 1/2019 | Izawa | |
| 10,259,164 B2 | 4/2019 | Bader et al. | |
| 2007/0231981 A1 | 10/2007 | Sreenivasan et al. | |
| 2007/0278712 A1 | 12/2007 | Okushima et al. | |
| 2009/0115110 A1 | 5/2009 | Schumaker | |

(Continued)

FOREIGN PATENT DOCUMENTS

| | | |
|---|---|---|
| JP | 2012004354 A | 1/2012 |
| JP | 2015233101 A | 12/2015 |

*Primary Examiner* — Robert J Grun
(74) *Attorney, Agent, or Firm* — Canon U.S.A., Inc. IP Division

(57) ABSTRACT

Devices, systems, and methods (a) receive a field material map that represents of a spatial distribution of a volume of a material over a rectangular region; (b) divide the rectangular region into two rectangular child regions along a division axis; (c) determine if the material volume in each rectangular child region is within a range of a specific volume; (d) for each rectangular child region that is not within the range of the specific volume, perform (b) for each rectangular child region as the rectangular region along a division axis that has been rotated by 90 degrees relative to the division axis that was used to generate the rectangular child region; (e) repeat (b)-(d) until all rectangular child regions meet the criteria in (c); and (f) output a drop pattern that includes one or more drop locations inside each rectangular child region that meets the criteria in (c).

20 Claims, 13 Drawing Sheets

(56) References Cited

U.S. PATENT DOCUMENTS

2010/0096470 A1    4/2010   Truskett
2010/0098859 A1    4/2010   Schumaker
2020/0292934 A1*   9/2020   Simpson ............. B29C 35/0805

* cited by examiner

Vertical Marginal Sums

|   |   |   |   |   |   |   |   |       |
|---|---|---|---|---|---|---|---|-------|
| 0 | 5 | 3 | 9 | 8 | 5 | 1 | 6 |       |
| 7 | 1 | 6 | 2 | 7 | 4 | 2 | 0 |       |
| 4 | 2 | 7 | 1 | 6 | 9 | 1 | 4 |       |
| 5 | 1 | 3 | 0 | 8 | 7 | 6 | 5 |       |
| 2 | 7 | 0 | 9 | 5 | 3 | 0 | 9 |       |
| 3 | 8 | 9 | 5 | 5 | 7 | 3 | 8 |       |
| 9 | 4 | 2 | 6 | 4 | 8 | 2 | 1 |       |
| 3 | 8 | 2 | 6 | 1 | 2 | 4 | 7 |       |
| 33 | 36 | 32 | 38 | 44 | 45 | 19 | 40 | 287 |
| 33 | 69 | 101 | 139 | 183 | 228 | 247 | 287 | 143.5 |

FIG. 6A

Horizontal Marginal Sums

| 0 | 5 | 3 | 9 | 8 | 5 | 1 | 6 | 37 | 37 |
|---|---|---|---|---|---|---|---|----|----|
| 7 | 1 | 6 | 2 | 7 | 4 | 2 | 0 | 29 | 66 |
| 4 | 2 | 7 | 1 | 6 | 9 | 1 | 4 | 34 | 100 |
| 5 | 1 | 3 | 0 | 8 | 7 | 6 | 5 | 35 | 135 |
| 2 | 7 | 0 | 9 | 5 | 3 | 0 | 9 | 35 | 170 |
| 3 | 8 | 9 | 5 | 5 | 7 | 3 | 8 | 48 | 218 |
| 9 | 4 | 2 | 6 | 4 | 8 | 2 | 1 | 36 | 254 |
| 3 | 8 | 2 | 6 | 1 | 2 | 4 | 7 | 33 | 287 |
|   |   |   |   |   |   |   |   | 287 | 143.5 |

FIG. 6B

Horizontal Marginal Sums

| | | | | 163 | 164 |
|---|---|---|---|---|---|
| 0 | 5 | 3 | 9 | 17 | 17 |
| 7 | 1 | 6 | 2 | 16 | 33 |
| 4 | 2 | 7 | 1 | 14 | 47 |
| 5 | 1 | 3 | 0 | 9 | 56 |
| 2 | 7 | 0 | 9 | 18 | 74 |
| 3 | 8 | 9 | 5 | 25 | 99 |
| 9 | 4 | 2 | 6 | 21 | 120 |
| 3 | 8 | 2 | 6 | 19 | 139 |
| | | | | 139 | 69.5 |

FIG. 7A

Vertical Marginal Sums

| 0 | 5 | 3 | 9 | 8 | 5 | 1 | 6 | |
|---|---|---|---|---|---|---|---|---|
| 7 | 1 | 6 | 2 | 7 | 4 | 2 | 0 | |
| 4 | 2 | 7 | 1 | 6 | 9 | 1 | 4 | |
| 5 | 1 | 3 | 0 | 8 | 7 | 6 | 5 | |
| 2 | 7 | 0 | 9 | 5 | 3 | 0 | 9 | |
| 18 | 16 | 19 | 21 | 34 | 28 | 10 | 24 | 170 |
| 18 | 34 | 53 | 74 | 108 | 136 | 146 | 170 | 85 |

FIG. 7B

SYSTEMS AND METHODS FOR GENERATING DROP PATTERNS

BACKGROUND

Technical Field: This application generally concerns generating drop patterns for imprint lithography.

Background: Nano-fabrication includes the fabrication of very small structures that have features that are 100 nanometers or smaller. One application of nano-fabrication is the fabrication of integrated circuits. The semiconductor-processing industry continues to strive for larger production yields while increasing the circuits per unit area formed on a substrate. Improvements in nano-fabrication include providing greater process control and improving throughput while also allowing continued reduction of the minimum feature dimensions of the structures formed.

One nano-fabrication technique is commonly referred to as nanoimprint lithography. Nanoimprint lithography is useful in a variety of applications including, for example, fabricating one or more layers of integrated devices. Examples of an integrated device include CMOS logic, microprocessors, NAND Flash memory, NOR Flash memory, DRAM memory, MRAM, 3D cross-point memory, Re-RAM, Fe-RAM, STT-RAM, MEMS, and the like. Examples of nanoimprint lithography systems and processes are described in detail in numerous publications, such as U.S. Pat. Nos. 8,349,241, 8,066,930, and 6,936,194.

The nanoimprint lithography technique disclosed in each of the aforementioned patents describes the formation of a relief pattern in a formable material (polymerizable) layer and transferring a pattern corresponding to the relief pattern into or onto an underlying substrate. The patterning process uses a template spaced apart from the substrate, and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device (article) fabrication, including, for example, curing, oxidation, layer formation, deposition, doping, planarization, etching, formable material removal, dicing, bonding, packaging, and the like.

SUMMARY

Some embodiments of a method comprise (a) receiving a field material map that represents of a spatial distribution of a volume of a material over a rectangular region; (b) dividing the rectangular region into two rectangular child regions along a division axis, wherein the material volumes of the two rectangular daughter regions are approximately equal; (c) determining if the material volume in each rectangular child region is within a range of a specific volume; (d) for each rectangular child region that is not within the range of the specific volume, performing (b) for each rectangular child region as the rectangular region along a division axis that has been rotated by 90 degrees relative to the division axis that was used to generate the rectangular child region; (e) repeating (b)-(d) until all rectangular child regions meet the criteria in (c); and (f) outputting a drop pattern that includes one or more drop locations inside each rectangular child region that meets the criteria in (c).

Some embodiments of device comprise one or more computer-readable media and one or more processors in communication with the one or more computer-readable media. Also, the one or more processors and the one or more computer-readable media are configured to cause the device to obtain a field material map; divide a region in the field material map into two child regions; determine that a respective material volume of each of the two child regions is not within a range of a threshold volume; in response to determining that the respective material volume of each of the two regions is not within the range of the threshold volume, divide each of the two child regions into two additional respective child regions, determine that a respective material volume of each of the additional respective child regions is within the range of the threshold volume, and in response to determining that the respective material volume of each of the additional respective child regions is within the range of the threshold volume, generating a drop pattern that includes one or more drop locations in each of the additional respective child regions.

Some embodiments of one or more computer-readable storage media store instructions that, when executed by one or more computing devices, cause the one or more computing device to perform operations that comprise obtaining a field material map; dividing the field material map into two regions; recursively dividing the two regions into more regions, wherein each recursive dividing generates two respective child regions from a respective parent region, until a respective material volume of each child region that is not also a parent region is within a range of a specified volume; and generating a drop pattern that includes one or more respective drop locations in each of the child regions that is not also a parent region.

BRIEF DESCRIPTION OF THE DRAWINGS

FIGS. 6A-B illustrate example embodiments of marginal sums of a region in a field material map.

FIGS. 7A-B illustrate example embodiments of marginal sums of a region in a field material map.

DESCRIPTION

Figure 1:
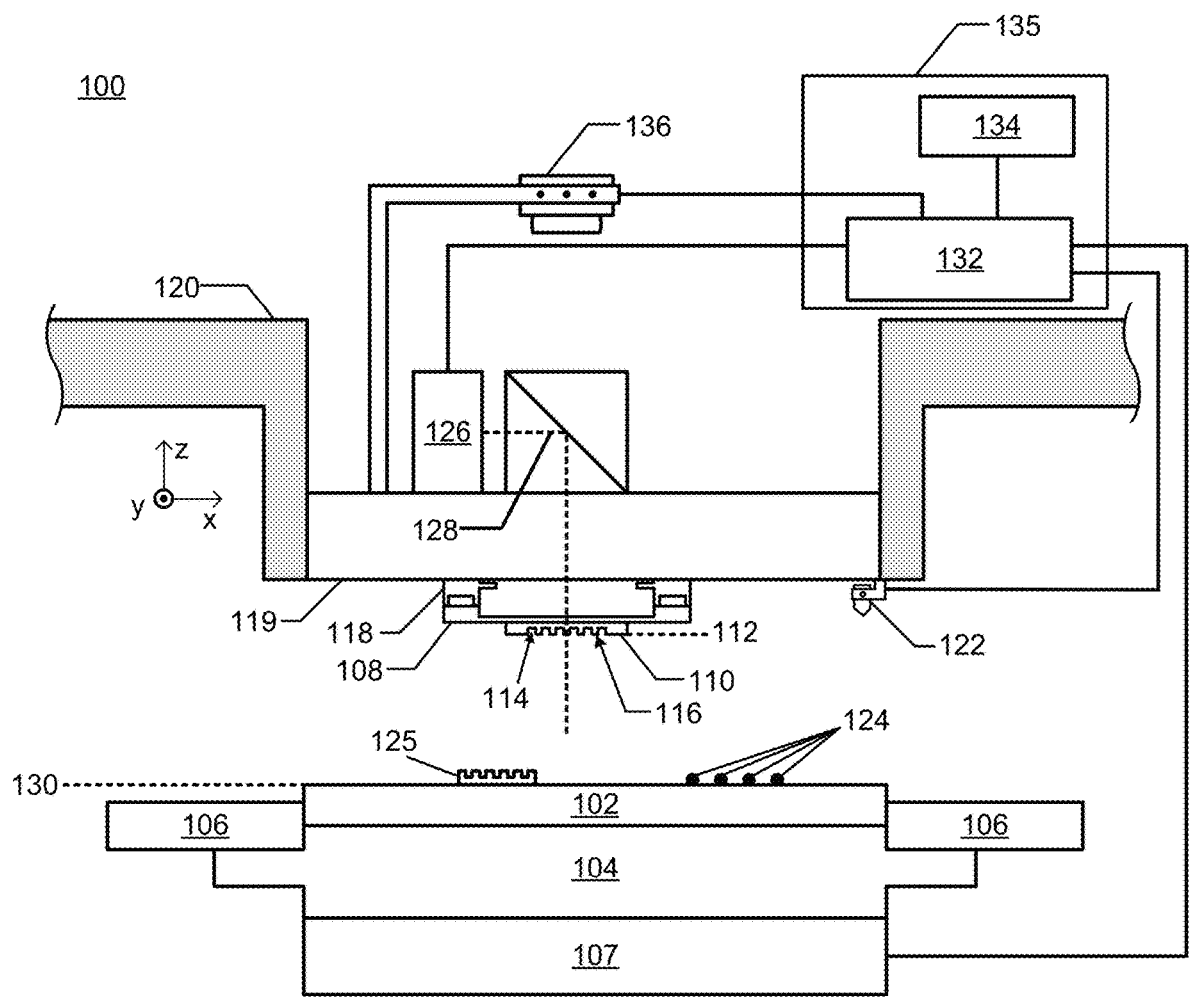
FIG. 1 illustrates an example embodiment of a nanoimprint lithography system.

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments.

Also, as used herein, the conjunction "or" generally refers to an inclusive "or," though "or" may refer to an exclusive "or" if expressly indicated or if the context indicates that the "or" must be an exclusive "or."

Furthermore, in this description and the drawings, an alphabetic suffix on a reference number may be used to indicate a specific instance of the feature identified by the reference numeral. For example, the imprint fields in a group of imprint fields may be identified with the reference numeral 141 when a particular imprint field is not being distinguished. However, 141A may be used to identify a specific imprint field when the specific imprint field is being distinguished from the rest of the imprint fields 141.

FIG. 1 illustrates an example embodiment of a nanoimprint lithography system 100. When operating, the nanoimprint lithography system 100 deposits drops 124 of formable material (e.g., resist) on a substrate 102 (e.g., a wafer) and forms a patterned layer 125, which has a relief pattern, in the formable material in an imprint field on the substrate 102 by using a template 108, which has a mesa (also referred to as a mold) 110 that has a patterning surface 112, to imprint the formable material on the substrate 102. A single mesa 110 may be used to imprint formable material in a plurality of imprint fields on a single substrate 102 or a plurality of substrates 102.

In the embodiment in FIG. 1, the perimeter of the substrate 102 is surrounded by an applique 106. The applique 106 may be configured to stabilize the local gas environment beneath the template 108 and/or help protect the patterning surface 112 from particles, for example when the template is not above the substrate surface 130. Furthermore, an upper surface of the applique 106 may be below (e.g., as shown in FIG. 1) or coplanar with the substrate surface 130.

Also, the substrate 102 is coupled to a substrate chuck 104, which also supports the applique 106. Examples of substrate chucks 104 include the following: vacuum chucks, pin-type chucks, groove-type chucks, electrostatic chucks, and electromagnetic chucks. In some embodiments, such as the embodiment shown in FIG. 1, the applique 106 is mounted on the substrate chuck 104 without any part of the applique being sandwiched between the substrate chuck 104 and the substrate 102. The substrate chuck 104 is supported by the substrate-positioning stage 107.

The substrate-positioning stage 107 may provide translational or rotational motion along one or more of the x, y, z, θ, and φ-axes. The substrate-positioning stage 107, the substrate 102, and the substrate chuck 104 may also be positioned on a base (not shown). Additionally, the substrate-positioning stage 107 may be a part of a positioning system or a positioning subsystem.

The nanoimprint lithography system 100 also includes a template 108. The template 108 may include a body that includes the mesa 110 (also referred to as a mold), which extends toward the substrate 102 along the z axis. The mesa 110 may have a patterning surface 112 thereon. Also, the template 108 may be formed without the mesa 110. Thus, in some embodiments, the surface of the template 108 that faces the substrate 102 functions as the mesa 110, and the patterning surface 112 is included on the surface of the template 108 that faces the substrate 102. Examples of materials that may constitute the template 108 or the mesa 110 include the following: fused-silica, quartz, silicon, organic polymers, siloxane polymers, borosilicate glass, fluorocarbon polymers, metal, and hardened sapphire.

The patterning surface 112 has features that are defined by a plurality of spaced-apart template recesses 114 or template protrusions 116, though some embodiments include other configurations (e.g., a planar surface). The patterning surface 112 defines a pattern that forms the basis (e.g., an inverse) of the relief pattern of the patterned layer 125, which is formed from the drops 124 of formable material on the substrate 102. In some embodiments, the patterning surface 112 is featureless, in which case a planar surface is formed from formable material on the substrate 102. In some embodiments (e.g., embodiments that perform Inkjet-based Adaptive Planarization), the patterning surface 112 is featureless and the substantially the same size as the substrate 102, in which case a planar surface is formed from formable material across the entire substrate 102.

The template 108 may be coupled to a template chuck 118. Examples of template chucks 118 include the following: vacuum chucks, pin-type chucks, groove-type chucks, electrostatic chucks, and electromagnetic chucks. The template chuck 118 may be configured to apply a force to the template 108 that varies across the template 108. The template chuck 118 may be coupled to an imprint head 119, which in turn may be moveably coupled to a bridge 120 such that the template chuck 118, the imprint head 119, and the template 108 are moveable in at least the z-axis direction. In some embodiments, the template chuck 118, the imprint head 119, and the template 108 are also movable in one or more of the x, y, θ, and φ-axes directions. The nanoimprint lithography system 100 may include one or more motors that move the template 108, the template chuck 118, or the imprint head 119.

The nanoimprint lithography system 100 also includes a fluid dispenser 122. The fluid dispenser 122 may also be moveably coupled to the bridge 120. In some embodiments, the fluid dispenser 122 and the template chuck 118 share one or more positioning components. And in some embodiments, the fluid dispenser 122 and the template chuck 118 move independently of each other.

When operating, the fluid dispenser 122 deposits drops 124 of liquid formable material onto the substrate 102 according to a drop pattern. The formable material may be, for example, a resist (e.g., photo resist) or another polymerizable material, and the formable material may comprise a mixture that includes a monomer.

The drops 124 of formable material may be dispensed upon the substrate 102 before or after a desired volume is defined between the patterning surface 112 and the substrate 102, depending on design considerations. Different fluid dispensers 122 may use different technologies to dispense the drops 124. When the formable material is jettable, ink-jet-type fluid dispensers 122 may be used to dispense the drops 124 of formable material. For example, thermal ink jetting, microelectromechanical-systems-based (MEMS-based) ink jetting, and piezoelectric ink jetting are technologies for dispensing jettable liquids.

Furthermore, additional formable material may be added to the substrate 102 using various techniques, for example drop dispense, spin-coating, dip coating, chemical vapor deposition (CVD), physical vapor deposition (PVD), thin film deposition, thick film deposition, or the like.

The nanoimprint lithography system 100 also includes an energy source 126 that directs actinic energy along an exposure path 128. The imprint head 119 and the substrate-positioning stage 107 may be configured to position the template 108 and the substrate 102 on (e.g., in superimposition with) the exposure path 128. A camera 136 may likewise be positioned such that an imaging field of the camera 136 is in superimposition with at least part of the exposure path 128.

Once the drops 124 of formable material have been deposited on the substrate, either the imprint head 119, the substrate-positioning stage 107, or both varies a distance between the mesa 110 and the substrate 102 to define a desired field volume that is filled by the formable material. For example, the imprint head 119 may apply a force to the template 108 that moves the mesa 110 into contact with the drops 124 of formable material that are on the substrate 102. After the desired field volume is filled with the formable material, the energy source 126 produces energy (e.g., actinic radiation (UV)) that is directed along the exposure path 128 to the formable material and that causes the formable material to cure, solidify, or cross-link in conformance to a shape of the substrate surface 130 and the patterning surface 112, thereby defining a patterned layer 125 on the substrate 102. The formable material is cured while the template 108 is in contact with the formable material, thereby forming the patterned layer 125 on the substrate 102. Thus, the nanoimprint lithography system 100 uses an imprinting process to form the patterned layer 125, which has recesses and protrusions that are an inverse of the pattern in the patterning surface 112.

The imprinting process may be done repeatedly in a plurality of imprint fields (e.g., the imprint fields 141 in FIG. 2) that are spread across the substrate surface 130. For example, each of the imprint fields may be the same size as the mesa 110 or the same size as only the pattern area 115 of the mesa 110. The pattern area 115 of the mesa 110 is a region of the patterning surface 112 that is used to imprint patterns on a substrate 102 (e.g., a region that includes the template recesses 114 and the template protrusions 116). The pattern area 115 of the mesa 110 may include fluid control features that are used to prevent extrusions. In some embodiments, the substrate 102 has only one imprint field, and the imprint field is the same size as the substrate 102 or as the area of the substrate 102 which is to be patterned with the mesa 110. Also, in some embodiments, the imprint fields overlap. Some of the imprint fields may be partial imprint fields which intersect a boundary of the substrate 102.

The patterned layer 125 may be formed such that it has a residual layer that has a residual layer thickness (RLT) above a highest point on the substrate surface 130 in each imprint field. The patterned layer 125 may also include one or more features, such as protrusions, that extend above the residual layer. These protrusions match the recesses 114 in the patterning surface 112 of the mesa 110.

The patterned layer 125 can be further subjected to known steps and processes for article (e.g., device) fabrication, including, for example, curing, oxidation, layer formation, deposition, doping, planarization, etching, formable material removal, dicing, bonding, packaging, and the like. Examples of articles include CMOS logic, microprocessors, NAND Flash memory, NOR Flash memory, DRAM memory, MRAM, 3D cross-point memory, Re-RAM, Fe-RAM, STT-RAM, and MEMS.

The nanoimprint lithography system 100 may be regulated, controlled, or directed by one or more processors 132 (e.g., controllers) in communication with one or more other components or subsystems, such as the substrate-positioning stage 107, the imprint head 119, the fluid dispenser 122, the energy source 126, or the camera 136, and may operate based on instructions in a computer-readable program stored in one or more non-transitory computer-readable media 134. In some embodiments, including the embodiment in FIG. 1, the one or more processors and the one or more non-transitory computer-readable media 134 are included in a nanoimprint-lithography-control device 135. The nanoimprint-lithography-control device 135 regulates, controls, or directs the operations of the nanoimprint lithography system 100.

Each of the one or more processors 132 may be or may include one or more of the following: a central processing units (CPU), which may include microprocessors (e.g., a single core microprocessor, a multi-core microprocessor); a graphics processing unit (GPUs); an application-specific integrated circuit (ASIC); a field-programmable-gate array (FPGA); a digital signal processors (DSP); a specially-configured computer; and other electronic circuitry (e.g., other integrated circuits). For example, a processor 132 may be a purpose-built controller or may be a general-purpose controller that has been specially-configured to be a nanoimprint-lithography-system controller.

Examples of non-transitory computer-readable media include, but are not limited to, a magnetic disk (e.g., a floppy disk, a hard disk), an optical disc (e.g., a CD, a DVD, a Blu-ray), a magneto-optical disk, magnetic tape, semiconductor memory (e.g., a non-volatile memory card, flash memory, a solid-state drive, SRAM, DRAM, EPROM, EEPROM), a networked attached storage (NAS), an intranet-connected non-transitory computer-readable storage device, and an internet-connected non-transitory computer-readable storage device.

In the embodiment in FIG. 1, the nanoimprint-lithography-control device 135 may generate one or more drop patterns, and the nanoimprint-lithography-control device 135 may obtain the one or more drop patterns from another device (e.g., a drop-pattern-generation device that generated the one or more drop patterns). For example, the one or more processors 132 may be in communication with a networked computing device on which analysis is performed and control files, such as a drop pattern, are generated.

A drop pattern indicates where the fluid dispenser 122 should deposit drops 124 of liquid formable material onto the substrate 102. A drop pattern may be generated based on a field volume and on imprint-field features. The field volume indicates the volume of formable material required to produce all of the desired features of the patterned layer 125 (e.g., all of the features of the patterned layer 125 in an imprint field). Also, to account for imprint-field features, the density of the drop pattern may vary across the imprint field. And the drop pattern may have a uniform drop density over regions of the imprint field that have a uniform density (e.g., blank areas, or areas where the imprint-field features have a uniform feature density).

Figure 2:
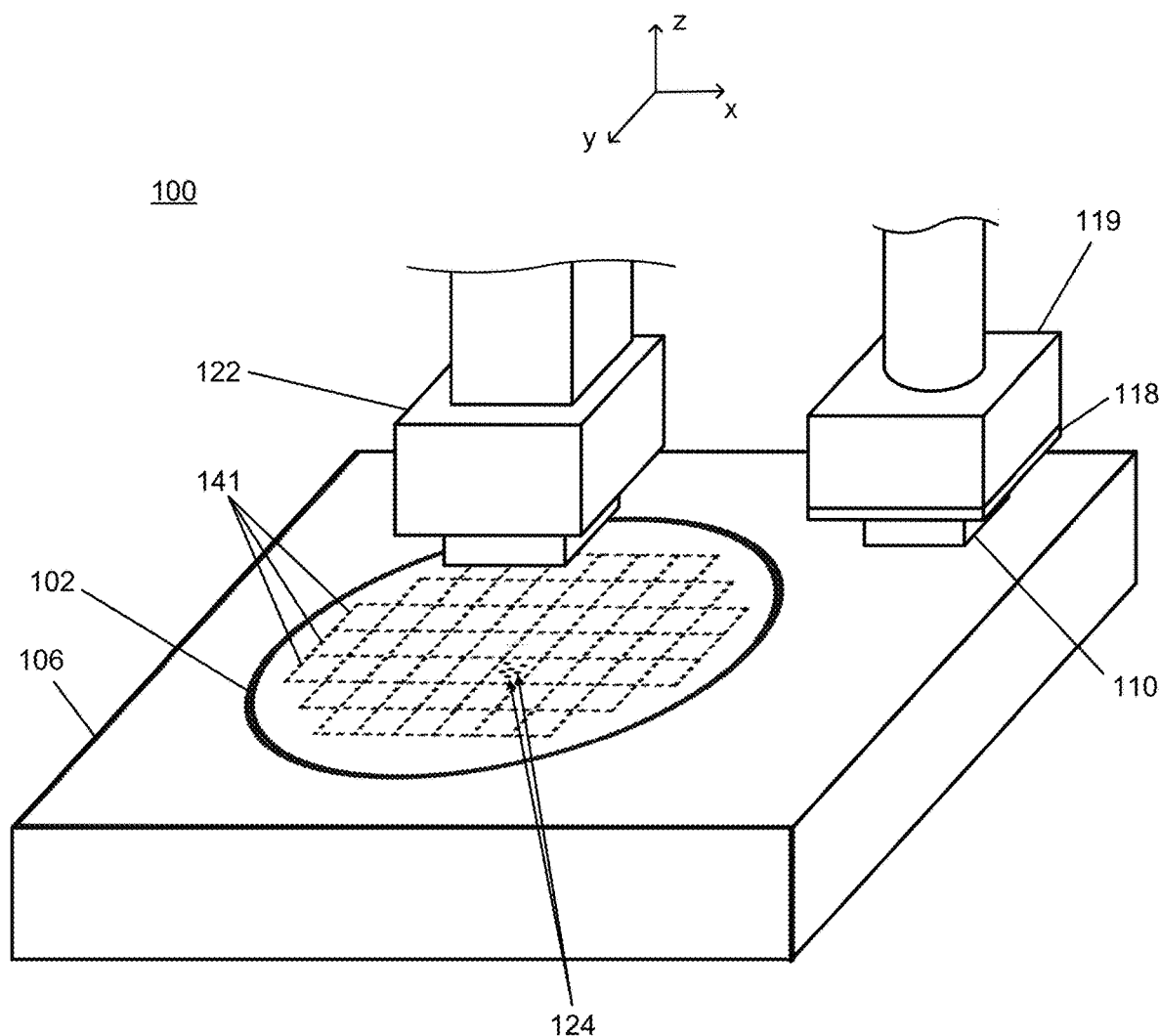
FIG. 2 illustrates a perspective view of an example embodiment of a nanoimprint lithography system.

FIG. 2 illustrates a perspective view of an example embodiment of a nanoimprint lithography system 100. This embodiment of a nanoimprint lithography system 100 includes a substrate 102, an applique 106, a fluid dispenser 122, a mesa 110, a template chuck 118, and an imprint head 119. Also, FIG. 2 illustrates a plurality of imprint fields 141 on the substrate 102. Additionally, the fluid dispenser 122 has deposited drops 124 of formable material on one of the imprint fields 141.

Figure 3:
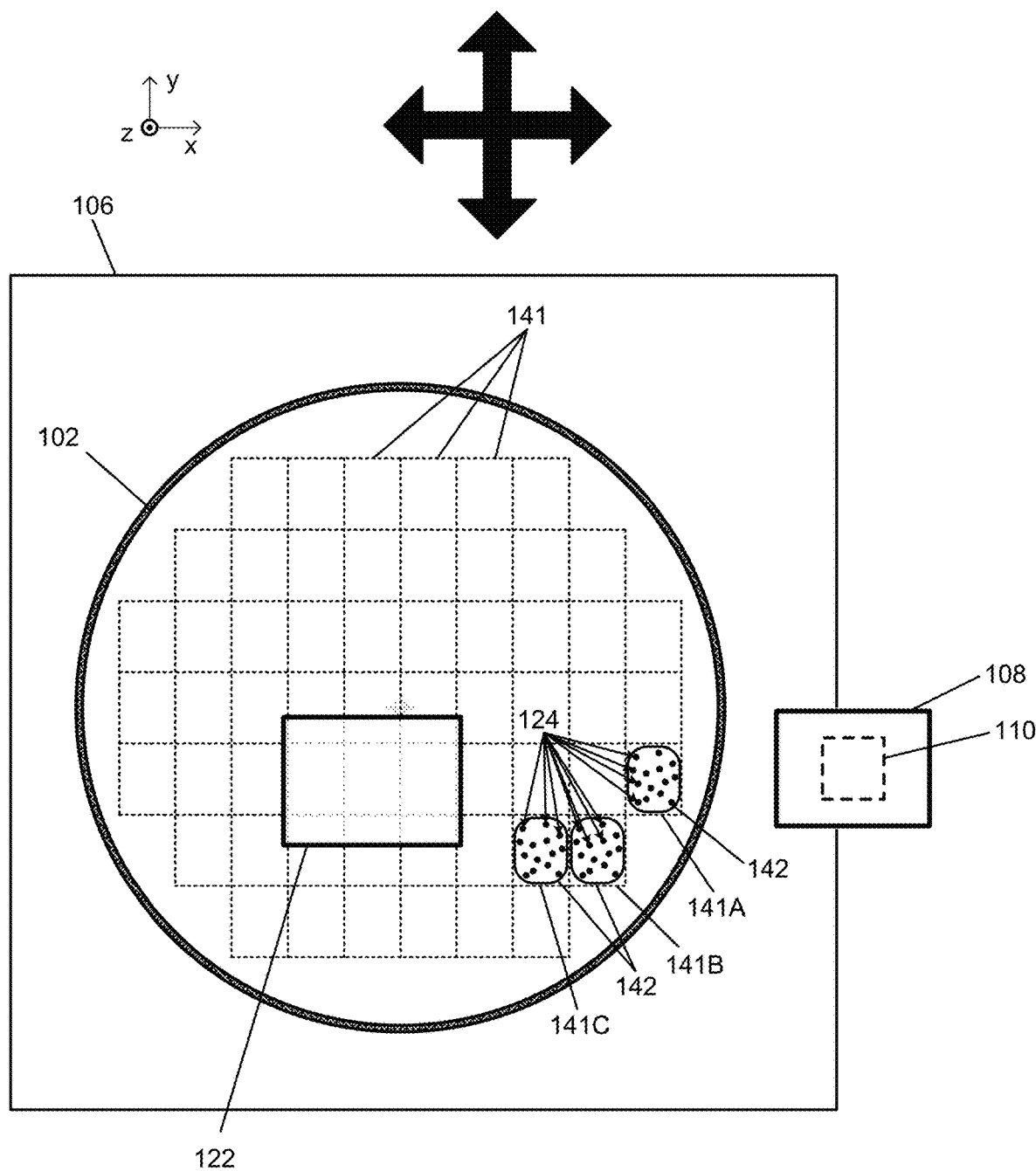
FIG. 3 illustrates a plan view (a view from along the z axis) of an example embodiment of a substrate, an applique, a fluid dispenser, a template, and a drop pattern.

FIG. 3 illustrates a plan view (a view from along the z axis) of an example embodiment of a substrate 102, an applique 106, a fluid dispenser 122, a template 108, and a drop pattern 142. The template 108 includes a mesa 110. The substrate 102 includes a plurality of imprint fields 141. On each of the imprint fields 141, a respective pattern may be formed from formable material (e.g., a patterned layer). The substrate-positioning stage that supports the applique 106 and the substrate 102 can move the applique 106 and the substrate 102 along both the x axis and the y axis. This allows the substrate-positioning stage to position each of the imprint fields 141 under the fluid dispenser 122, which deposits drops of formable material on the imprint field 141, and then under the template 108, which forms a pattern (e.g., a patterned layer) in the formable material that was deposited on the imprint field 141.

When an imprint field 141 is positioned under the fluid dispenser 122, the fluid dispenser 122 can deposits drops 124 of formable material on the imprint field 141. For example, FIG. 3 shows imprint fields 141A-C on which drops 124 of formable material have been deposited by the fluid dispenser 122 according to a drop pattern 142. In this embodiment, the fluid dispenser 122 deposited the drops 124 on each of the imprint fields 141A-C according to the same drop pattern 142. However, in some embodiments, the fluid dispenser 122 uses different drop patterns for some of the imprint fields 141.

Figure 4:
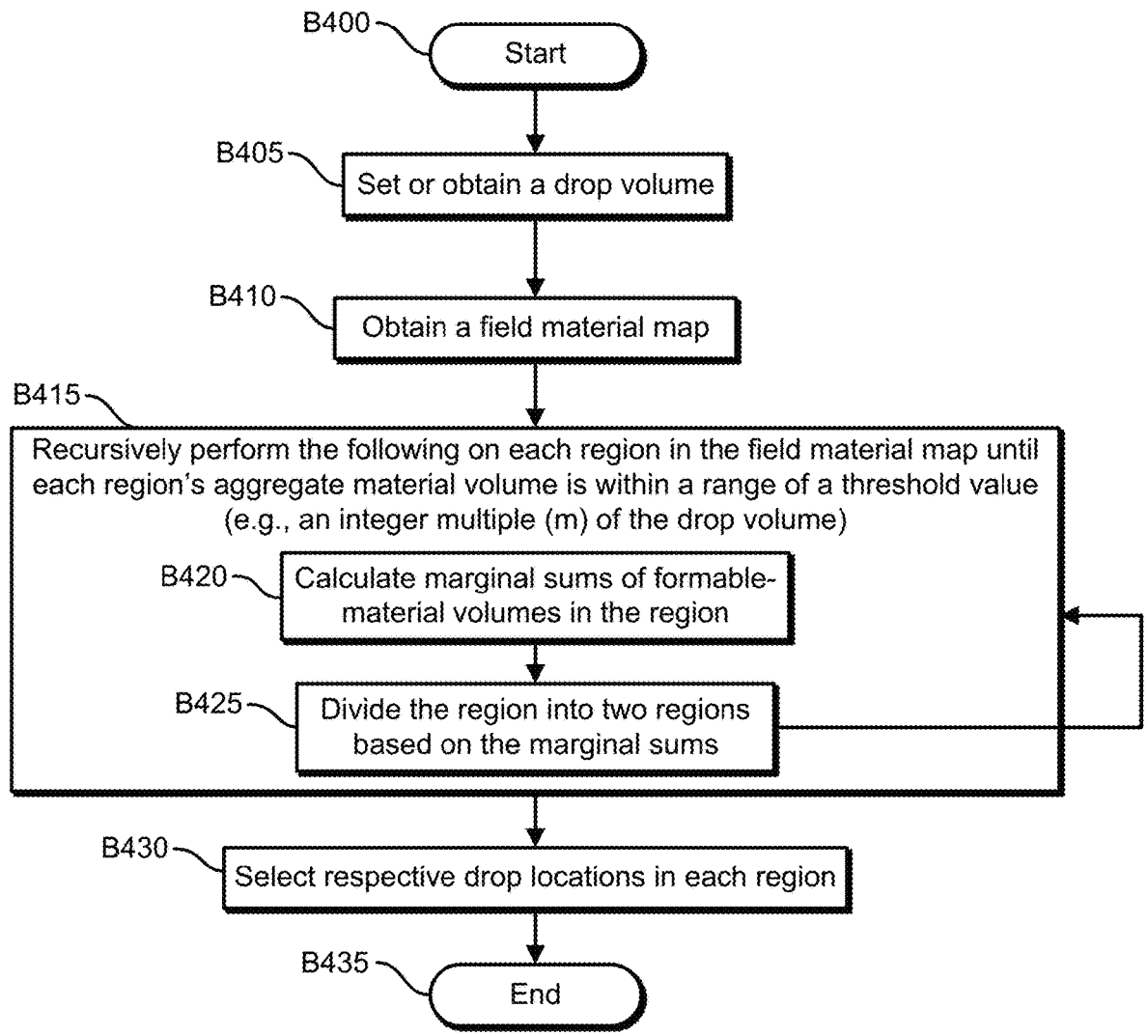
FIG. 4 illustrates an example embodiment of an operational flow for generating a drop pattern.

FIG. 4 illustrates an example embodiment of an operational flow for generating a drop pattern. Although this operational flow and the other operational flows that are described herein are each presented in a certain respective order, some embodiments of these operational flows perform at least some of the operations in different orders than the presented orders. Examples of different orders include concurrent, parallel, overlapping, reordered, simultaneous, incremental, and interleaved orders. Also, some embodiments of these operational flows include operations (e.g., blocks) from more than one of the operational flows that are described herein. Thus, some embodiments of the operational flows may omit blocks, add blocks (e.g., include blocks from other operational flows that are described herein), change the order of the blocks, combine blocks, or divide blocks into more blocks relative to the example embodiments of the operational flows that are described herein.

Furthermore, although this operational flow and the other operational flows that are described herein are performed by a drop-pattern-generation device, some embodiments of these operational flows are performed by two or more drop-pattern-generation devices or by one or more other specially-configured computing devices (e.g., one or more nanoimprint-lithography-control devices).

Figure 5:
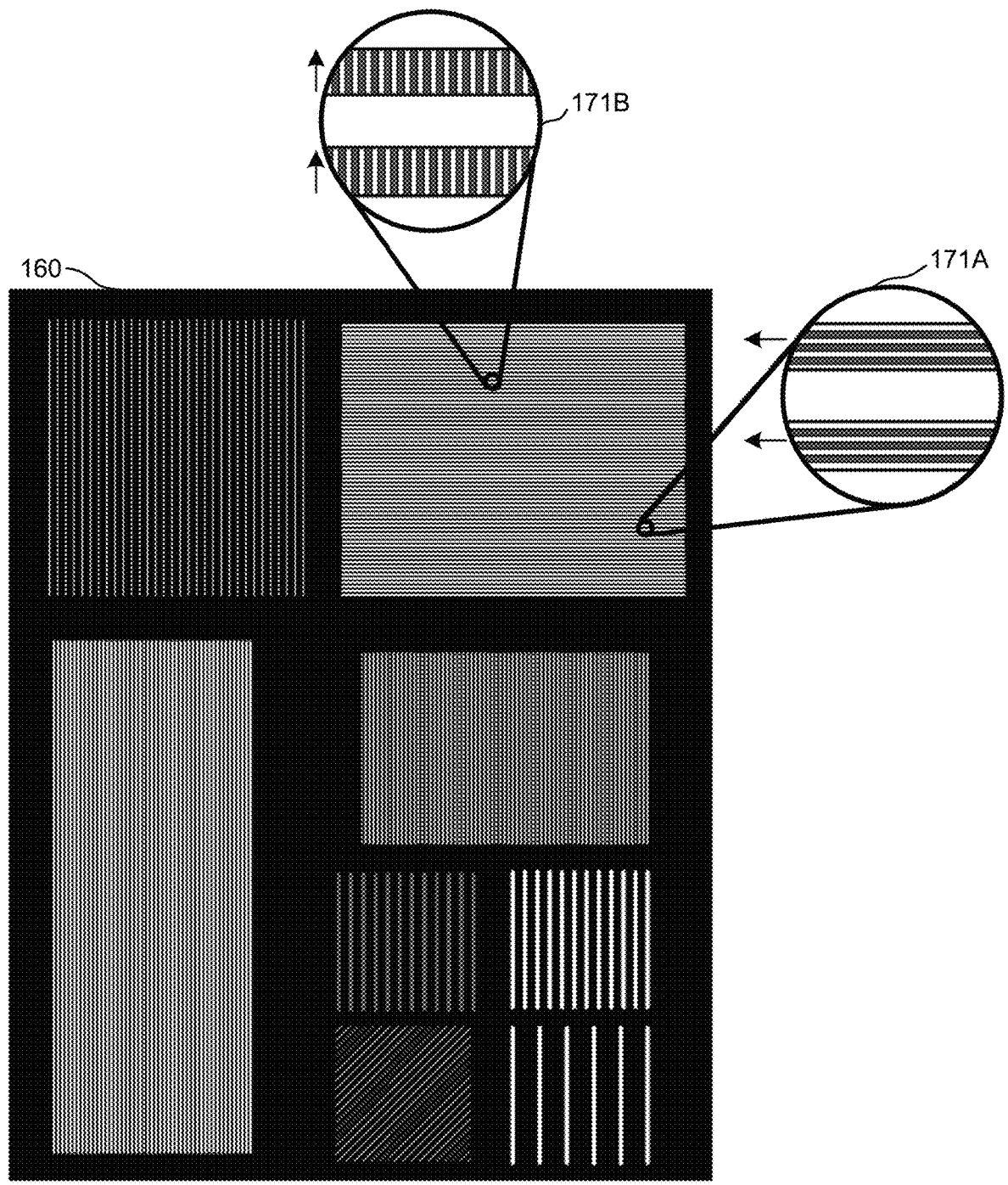
FIG. 5 illustrates an example embodiment of a field material map.

In FIG. 4, the flow starts in block B400 and then proceeds to block B405, where the drop-pattern-generation device sets or obtains (e.g., receives, retrieves) a volume of a drop of formable material (drop volume), which indicates the volume of formable material in a single drop. Depending on the components (e.g., fluid dispenser) of the corresponding nanoimprint lithography system, the drop volume may have a range of possible volumes (e.g., be adjustable), or the drop volume may have a fixed volume. Next, in block B410, the drop-pattern-generation device obtains a material map of one or more imprint fields (field material map). The field material map may cover an entire substrate. For example, a field material map may be an image (e.g., bitmap, PNG) in which the respective value of each tile (e.g., pixel) indicates a volume of imprint material (e.g., a thickness of a patterned layer, such as the patterned layer 125 in FIG. 1) at the tile's location. FIG. 5 illustrates an example embodiment of a field material map. The different shades in the field material map 160 indicate the respective volumes of imprint material at the locations of the tiles.

Next, in block B415, the drop-pattern-generation device recursively performs the operations in blocks B420-B425 for each region in the field material map until each region's aggregate material volume (the sum of the volumes of formable material in all the tiles in the region) is within a range of a threshold value. For example, the threshold value may be an integer multiple m of the drop volume. Exemplary values of the integer multiple m are: 1, 5, 10, 15, 20, and 25. Thus, in some embodiments, the threshold T may be described by the following: $T=m \times v$, where the drop volume is v. And, if the region's aggregate material volume a is either within a range r of the threshold T or less than the threshold T (e.g., if $a \leq T+r$), the recursive performance of blocks B420-B425 ends. An exemplary value of the range r is half an average of the volume requirement for each tile in the field material map 160. An exemplary value of the range r is five times an average of the volume requirement for each tile in the field material map 160. An exemplary value of the range r is based on statistical quantity of the volume requirement for each tile in the field material map 160. Also, in some embodiments the range is zero.

Also, the first time that the flow performs the operations that are in block B415, the region may be the entire field material map.

In block B420, the drop-pattern-generation device calculates the marginal sums of formable-material volumes in the region. For example, FIGS. 6A-B illustrate example embodiments of marginal sums of the formable-material volumes in a region of a field material map. The region, region 161A, has sixty-four tiles (arranged in eight rows and eight columns), region 161A includes a value at each tile, and each value indicates a respective material volume. Also, the aggregate material volume of region 161A is 287. The marginal sums of the values can be calculated vertically or horizontally. FIG. 6A shows examples of vertical marginal sums 163. The value of each vertical marginal sum 163 is the sum of the eight values in the column above the marginal sum 163. Also, FIG. 6A shows marginal-sum-aggregate values 164. In this example, the marginal-sum-aggregate values 164 are calculated from left to right. Thus, each marginal-sum-aggregate value 164 is the sum of the marginal sums 163 of the columns that are above or to the left of the marginal-sum-aggregate value 164. For example, the marginal-sum-aggregate value 164A that is 101 is the sum of the marginal sums (33, 36, 32) of the three columns that are above or to the left of the marginal-sum-aggregate value 164A.

Furthermore, FIG. 6B shows examples of horizontal marginal sums 163. The value of each horizontal marginal sum 163 is the sum of the eight values in the row to the left of the marginal sum 163. Also, like FIG. 6A, FIG. 6B shows marginal-sum-aggregate values 164. In this example, the marginal-sum-aggregate values 164 are calculated from top to bottom. Thus, each marginal-sum-aggregate value 164 is the sum of the marginal sums 163 of the rows that are above or to the left of the marginal-sum-aggregate value 164. For example, the marginal-sum-aggregate value 164A that is 135 is the sum of the marginal sums (37, 29, 34, 35) of the four rows that are above or to the left of the marginal-sum-aggregate value 164A.

Next, in block B425, the drop-pattern-generation device divides the region into two regions based on the marginal sums. The drop-pattern-generation device may divide the region into two regions so that the respective aggregate material volumes in the two regions are approximately equal. For example, in FIG. 6A, the drop-pattern-generation device may divide region 161A along a division axis 165 into two regions, regions 161B-C, so that the aggregate material volumes in regions 161B-C are equal or approximately equal. In FIG. 6A, to make regions 161B-C equal, each of the regions 161B-C would need an aggregate material volume that is equal to 143.5 (287÷2). Thus, the drop-pattern-generation device may divide region 161A into regions 161B-C between the column that has the marginal-sum-aggregate value 164 that is closest to 143.5 and the next column to the right.

Also for example, in FIG. 6B, region 161A is divided into two regions, regions 161D-E, along a division axis 165. To make regions 161D-E equal, both of regions 161D-E would need an aggregate material volume that is equal to 143.5. Thus, the drop-pattern-generation device may divide region 161A into regions 161D-E between the row that has the marginal-sum-aggregate value 164 that is closest to 143.5 and the next row below.

As noted above, the drop-pattern-generation device recursively performs the operations in blocks B415 (including blocks B420-B425) for each region until regions that have an aggregate material volume that is within a range of a threshold value are generated. Thus, blocks B420-B425 may be performed for regions that were generated in previous iterations of block B425. A region that is divided into two regions may be referred to as a "parent region," and the two regions that were generated by dividing a region into two regions may each be referred to as a "child region." A region may be both a parent region and a child region.

Also, in the layers of recursion, the drop-pattern-generation device may alternate between dividing regions horizontally and dividing regions vertically. Thus, for example, if a region is vertically divided into two regions, each of the two regions would be horizontally divided into two respective regions. For example, FIG. 7A shows a region, region 161B, that was generated by dividing region 161A in FIG. 6A into regions 161B-C along a division axis 165. Also, region 161A in FIG. 6A was vertically divided. Accordingly, because the parent region of region 161B was vertically divided (divided along a vertical division axis 165), in some embodiments, region 161B is horizontally divided (divided along a horizontal division axis 165). Thus, FIG. 7A also shows the horizontal marginal sums 163 and the horizontal marginal-sum-aggregate values 164 of region 161B. Because 69.5 is half of the aggregate material volume of region 161B, the drop-pattern-generation device divides region 161B into two regions 161F-G below the row that has the marginal-sum-aggregate value 164B that is closest to 69.5.

And, for example, FIG. 7B shows a region 161D that was generated by dividing region 161A in FIG. 6B into regions 161D-E along a division axis 165. Also, region 161A in FIG. 6B was horizontally divided. Accordingly, because the parent region of region 161D was horizontally divided (divided along a horizontal division axis 165), in some embodiments, region 161D in FIG. 7B is vertically divided (divided along a vertical division axis 165). Thus, FIG. 7B also shows the vertical marginal sums 163 and the vertical marginal-sum-aggregate values 164 of the region 161D. Because 85 is half of the aggregate material volume of region 161D, the drop-pattern-generation device divides the region 161D into two regions, regions 161H-I, after the column that has the marginal-sum-aggregate value 164D that is closest to 85.

Figure 8:
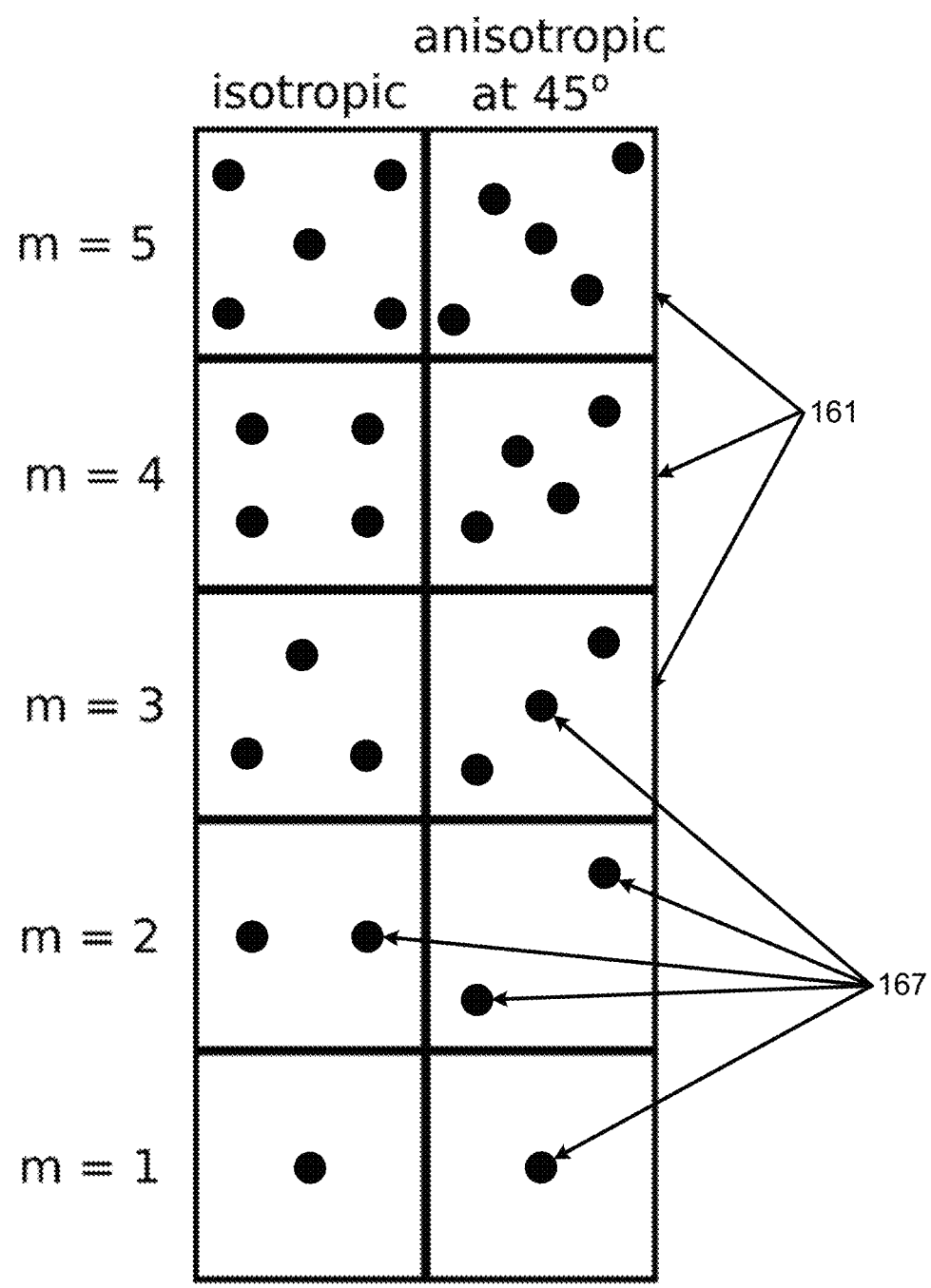
FIG. 8 illustrates example embodiments of drop locations within regions.

In FIG. 4, then the flow moves to block B430, where the drop-pattern-generation device selects respective drop locations in each region, and then the flow ends in block B435. For example, FIG. 8 illustrates example embodiments of drop locations within regions. FIG. 8 illustrates ten regions 161 and the drop locations 167 within each region 161. The drop locations 167 can be further based on user inputs or other factors, such as the directionality of patterns and pattern features of a template and/or a substrate, which may influence the dynamics and directionality of the fluid spread process. For example, a directional pattern, such as a line/space array, can induce fluid to spread far more quickly along a principal axis direction of the array relative to the direction perpendicular to such principal axis direction. The principal axis direction denotes the direction in which recesses with a pitch (that is, for example, 10-80 nm wide) in a patterning surface extend along a length (which, for example, may be at least 20 times the pitch), and, when the liquid formable material fills in the recesses in the patterning surface (e.g., when the patterning surface is lowered onto the formable material), this is the direction in which the liquid formable material most-readily flows (examples of recesses include the recesses 114 in the patterning surface 112 in FIG. 1). For example, if the inverse of the field material map in FIG. 5 (not to scale) was a patterning surface, then the principal axis direction of the recess in a first area 171A would be the x axis direction, and the principal axis direction of the recess in a second area 171B would be the y axis direction. In some embodiments, the principal axis denotes the direction in which recesses extend in at least one of the following: the field material map, the patterning surface, and the substrate surface. Directionality may be stored as vector for each cell indicating the direction of preferred flow and the magnitude of the preference.

Thus, the entire operational flow for generating a drop pattern is non-iterative and deterministic. And, in embodiments where all regions have the same (or approximately the same) total material volume, and the regions all get the same number of drops placed in them. Also, the resulting drop pattern may have several desirable characteristics: First, the drop pattern may adapt well to the features of the imprint field. Regions of high feature density may be finely split compared to regions of low feature density, which in turn means that the drop density will follow the feature density. Second, the drop pattern may be uniform or nearly uniform over blank and constant feature-density regions because within the regions, all regions can be split down to the same level of granularity. Third, the number of drops in the drop pattern may be equal to the total required material volume over the field material map divided by the drop volume. Fourth, the run time may depend on the ratio of the total field volume to the product of the integer multiple and the drop volume (integer multiple m×drop volume), and only weakly depend on the field resolution or size. Fifth, the resulting drop pattern may not depend on any initializations, randomized or otherwise, or tolerances. In addition, there are no convergence issues since the drop-location selection is non-iterative.

Furthermore, in some embodiments, each region is rectangular in shape, each region contains the field-material-map tiles (e.g., pixels) that are located within its rectangular boundaries, and the sum of the material volume of all the tiles contained in a single region is equal or approximately equal to an integer multiple (m) of the drop volume.

Additionally, some embodiments of the drop-pattern-generation device generate a K-D tree (e.g., a two-dimensional K-D tree) when dividing an imprint field or a region into smaller regions. K-D trees store spatial information (e.g., positions of drops in a plane) by recursively dividing a region of interest by planes parallel to the dimensions of the space. For example, for a two-dimensional K-D tree, the region of interest may be a rectangle that initially contains all the tiles in a field material map. This rectangle is split by a plane (a line in two dimensions) that is parallel to the horizontal direction into two smaller rectangles such that the sum of the material volumes of the tiles of each rectangle is the same or approximately the same. Each smaller rectangle is further split by a line parallel to the vertical direction into two smaller rectangles of equal or approximately equal material volumes. These operations are repeated recursively, with the split lines alternating from being parallel to the horizontal and vertical directions for every level of region split until all the regions have a total material volume that is equal or approximately equal to an integer multiple m of the drop volume, after which the region splitting terminates. The integer multiple m and the drop volume may be set by a user. Furthermore, the generation of the K-D tree is a non-iterative process.

For example, some embodiments of a drop-pattern-generation device implement the following algorithm:

```
Input: region, drop volume, m, field
Output: zero or two smaller regions resulting from a split, the region is recursively
split until the total material volume of the region is equal to m*drop volume
    If region type is horizontal, then split_type ← vertical
    If region type is vertical, then split_type ← horizontal
    Marginal_distribution ← MarginalDistribution(split_type,field,xmin,xmax,ymin,ymax)
    total_region_volume ← Sum(marginal_distribution)
    if(total_region_volume < m*drop_volume)
        return zero regions
    half_region_volume ← total_region_volume/2
    cumulative_sum ← 0.0
    split_index = 0;
    iterate over i such that i runs from xmin (ymin) to xmax (ymax) for horizontal
(vertical) regions
        cumulative_sum ← cumulative_sum + marginal_distribution[i]
        if cumulative_sum > half_region_volume
            split_index ← xmin (ymin) + i + 1 for horizontal (vertical) regions
            break out of the loop
    // get the center of the field cell at half the distribution
    split_location = field->CellStart(child_dimension,split_index);
    low_region.type ← split_type
    high_region.type ← split_type
    low_child.xmin = xmin
    low_child.xmax = xmax
    low_child.ymin = ymin
    low_child.ymax = ymax
    high_child.xmin = xmin
    high_child.xmax = xmax
    high_child.ymin = ymin
    high_child.ymax = ymax
    if split_type is vertical then:
        low_child.xmax ← split_index
        high_child.xmin ← split_index
    if split_type is horizontal then:
        low_child.ymax ← split_index
        high_child.ymin ← split_index
    SplitRegion(low_child, drop volume, m, field)
    SplitRegion(high_child, drop volume, m, field)
    return low_child,high_child
```

In the algorithm, a horizontal region is a region that was generated by horizontally splitting a larger region, while a vertical region is a region that was generated by vertically splitting a larger region. Each region stores the start and end indices of the pixels contained in it in both horizontal (xmin,xmax) and vertical (ymin,ymax) directions. The algorithm makes calls to MarginalDistribution, which returns an array that has a length that is equal to the number of columns of pixels for horizontal regions, and every entry in the array has the sum of the pixel material volumes along the corresponding column, or that returns an array that has a length that is equal to the number of rows of pixels for vertical regions, and every entry in the array has the sum of the pixel material volumes along the corresponding row. Finally, each region stores pointers to the two regions it gets split into (low_child and high_child).

Figure 9:
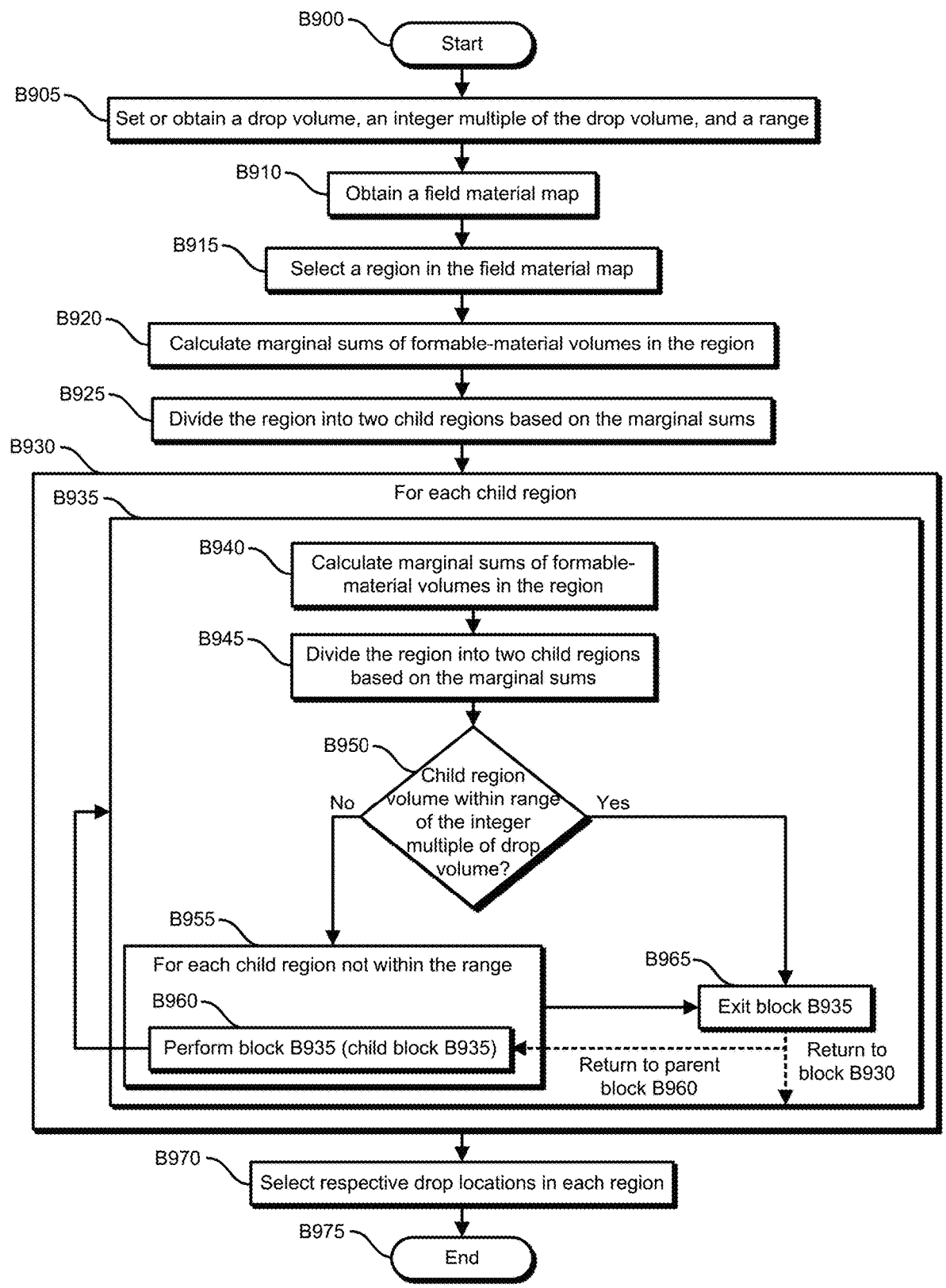
FIG. 9 illustrates an example embodiment of an operational flow for generating a drop pattern.

FIG. 9 illustrates an example embodiment of an operational flow for generating a drop pattern. The flow starts in block B900 and then proceeds to block B905, where a drop-pattern-generation device sets or obtains a drop volume, sets or obtains an integer multiple of the drop volume, and sets or obtains a range. Next, in block B910, the drop-pattern-generation device obtains a field material map. The flow then proceeds to block B915, where the drop-pattern-generation device selects a region in the field material map. In block B915, the region may be the entire field material map.

The flow then advances to block B920. In block B920, the drop-pattern-generation device calculates the marginal sums of the formable-material volumes in the region (the formable-material volumes are indicated by the values in the field material map). Then, in block B925, the drop-pattern-generation device divides the region into two child regions based on the marginal sums. Additionally, the region is the parent region of the two child regions that are generated in block B925.

In some embodiments, in blocks B920-B925, the drop-pattern-generation device may be set to perform a horizontal division, or, alternatively, a vertical division. And some embodiments of the drop-pattern-generation device select a horizontal division or, alternatively, a vertical division in blocks B920-B925 based on the features or the properties of the field material map (e.g., size, aspect ratio).

The flow then proceeds to block B930, where the drop-pattern-generation device performs block B935 for each child region.

Block B935 includes blocks B940-B965. In block B940, the drop-pattern-generation device calculates the marginal sums of the formable-material volumes in the region (the formable-material volumes are indicated by the values in the field material map). Then, in block B945, the drop-pattern-generation device divides the region into two child regions based on the marginal sums. Additionally, the region is the parent region of the two child regions that are generated in block B945.

Also, in embodiments where the drop-pattern-generation device alternates between horizontal division and vertical division, if the region was generated by a horizontal division (e.g., in block B925, in a previous performance of block B945), then the drop-pattern-generation device calculates vertical marginal sums in block B940 and performs a vertical division of the region in block B945 (e.g., as shown in FIGS. 6A and 7B). And, if the region was generated by a vertical division (e.g., in block B925, in a previous performance of block B945), then the drop-pattern-generation device calculates horizontal marginal sums in block B940 and performs a horizontal division of the region in block B945 (e.g., as shown in FIGS. 6B and 7A).

The flow then moves to block B950, where the drop-pattern-generation device determines whether the aggregate material volume of each of the child regions that was generated in block B945 is within the range of the integer multiple of the drop volume. For example, some embodiments of the drop-pattern-generation device determine if a≤(m×v)+r, where the child region's aggregate material volume is a, where the integer multiple is m, where the drop volume is v, and where the range is r. The range r may influence feature adaptivity (e.g., a larger range r may decrease feature adaptivity). Thus, adjusting the range r may adjust feature adaptivity. Also, in embodiments where the material map is divided into two child regions that have equal or approximately equal aggregate material volumes, the results of block B950 may often or always be the same for both child regions.

If the drop-pattern-generation device determines that the respective aggregate material volume of a child region is within the range of the integer multiple of the drop volume (block B950=Yes), then the flow moves to block B965 for that child region. If the drop-pattern-generation device determines that the respective aggregate material volume of a child region is not within the range of the integer multiple of the drop volume (block B950=No), then the flow moves to block B955 for that child region. In some embodiments, the operational flow splits into multiple operational flows (e.g., one operational flow for each child region). Also, the multiple operational flows may be performed simultaneously, serially, or in other orders.

In block B955, for each child region that has an aggregate material volume that is not within the range of the integer multiple of the drop volume, the drop-pattern-generation device performs block B960. In block B960, the drop-pattern-generation device performs the operations in block B935 for the respective child region. When block B935 is performed in block B960, the block B935 may be referred to herein as a "child block B935," and a block B960 that includes a child block B935 may be referred to herein as a "parent block B960." After block B955, the flow moves to block B965.

In block B965, the drop-pattern-generation device exits block B935. If block B935 is being performed in a parent block B960 (i.e., if block B935 is a child block B935), the flow then returns to the parent block B960. If the block B935 does not have a parent block B960, the flow then returns to block B930. After block B930, the flow moves to block B970.

In block B970, the drop-pattern-generation device selects respective drop locations in each region that is not a parent region (i.e., each region that does not have any child regions). Thus, for example, the drop-pattern-generation device selects respective drop locations in child regions that are not also parent regions (in child regions that were not further divided into more child regions). Also, the number of drop locations in each region may be equal to the integer multiple (m) of the drop volume. Then the flow ends in block B975.

Figure 10:
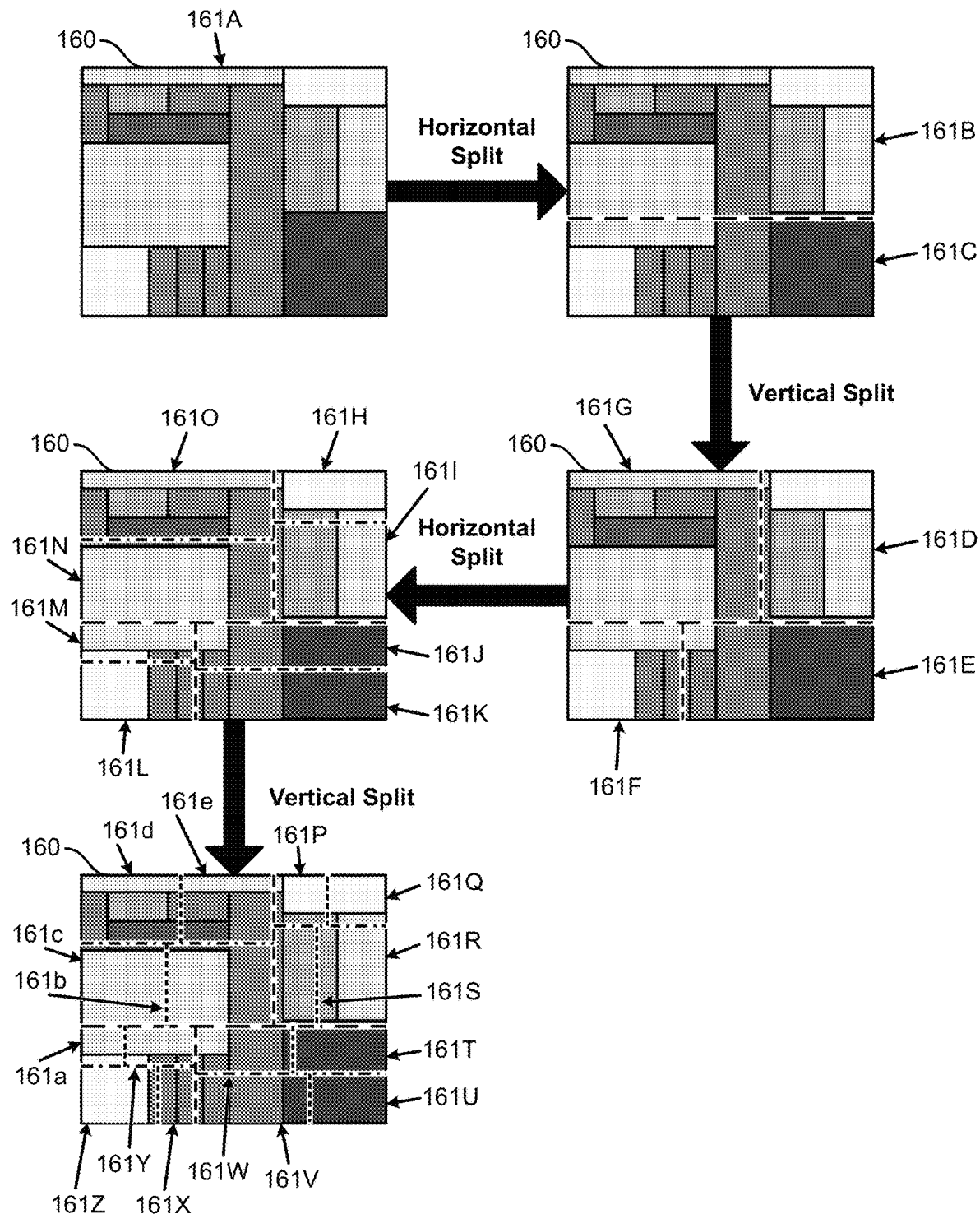
FIG. 10 illustrates example embodiments of regions.

FIG. 10 illustrates example embodiments of regions in a material map. Initially, the material map 160 has not been divided. Thus, in some embodiments, the entire material map 160 forms region 161A. For example, region 161A may be selected in block B915 in FIG. 9.

Region 161A is then horizontally divided (e.g., in blocks B920-B925 in FIG. 9) into regions 161B-C. Thus, region 161A is the parent region of regions 161B-C, and regions 161B-C are child regions of region 161A.

Regions 161B-C are then divided (e.g., in respective blocks B940-B945 in FIG. 9), thereby forming regions 161D-G. In this embodiment, the divisions alternate between horizontal divisions and vertical divisions. Thus, because regions 161B-C were formed by horizontal division, regions 161B-C are vertically divided to form regions 161D-G. Also, region 161B is the parent region of regions 161D and 161G, and region 161C is the parent region of regions 161E and 161F.

Because the aggregate material volumes of regions 161D-G are not within a range of an integer multiple of a drop volume, regions 161D-G are then horizontally divided, thereby forming regions 161H-O. For example, after block B945 is performed to generate regions 161D-G (which may require multiple iterations of block B945), the flow would then move to block B955 because regions 161D-G are not within a range of an integer multiple of a drop volume. In block B955, block B960 would then be respectively performed for each of regions 161D-G. When block B960 is performed for region 161D, a child block B935 would then be performed for region 161D. In the child block B935, in block B940 horizontal marginal sums would be calculated for region 161D, and then, in block B945, region 161D would be split into regions 161H and 161I based on the horizontal marginal sums.

Because the aggregate material volumes of regions 161H-O are not within a range of an integer multiple of a drop volume, regions 161H-O are then vertically divided, thereby forming regions 161P-e. For example, after block B945 has been performed to generate regions 161H-I (which may require multiple iterations of block B945), the flow would then move to block B955 because regions 161H-I are not within a range of an integer multiple of a drop volume. Block B960 would then be respectively performed for each of regions 161H-I. When block B960 is performed for region 161H, a child block B935 would then be performed for region 161H. In the child block B935, in block B940 vertical marginal sums would be calculated for region 161H, and then, in block B945, region 161H would be split into regions 161P and 161Q based on the vertical marginal sums.

Also for example, if the aggregate material volumes of regions 161P and 161Q were within a range of an integer multiple of a drop volume, then the flow in the child block B935, in which regions 161P and 161Q were generated from region 161H (child block H), would proceed from block B945, to block B950, to block B965.

In block B965, the flow exits the child block B935 and returns to the parent block B960, which includes the child block B935 that is performed for region 161H (child block H) and which is included in the block B935 that is performed for region 161D (child block D—the block B935 in which regions 161H and 161I were generated from region 161D).

After performing block B935 for region 161H and performing block B935 for region 161I in block B955, the flow in child block D would then move from block B955 to block B965, where the flow exits the child block B935 and returns to the parent block B960, which includes the block B960 that is performed for region 161D (child block D) and which is included in the block B935 that is performed for region 161B (block B—the block B935 in which regions 161D and 161G were generated from region 161B).

After performing block B960 for region 161D and performing block B960 for region 161G in block B955, the flow in block B would then move to from block B955 to block B965, where the flow exits block B935 and returns to block B930, which includes the block B935 that is performed for region 161B (block B) and includes the block B935 that is performed for region 161C.

After performing block B935 for regions 161B and 161C in block B930, the flow would then move from block B930 to block B970.

Figure 11:
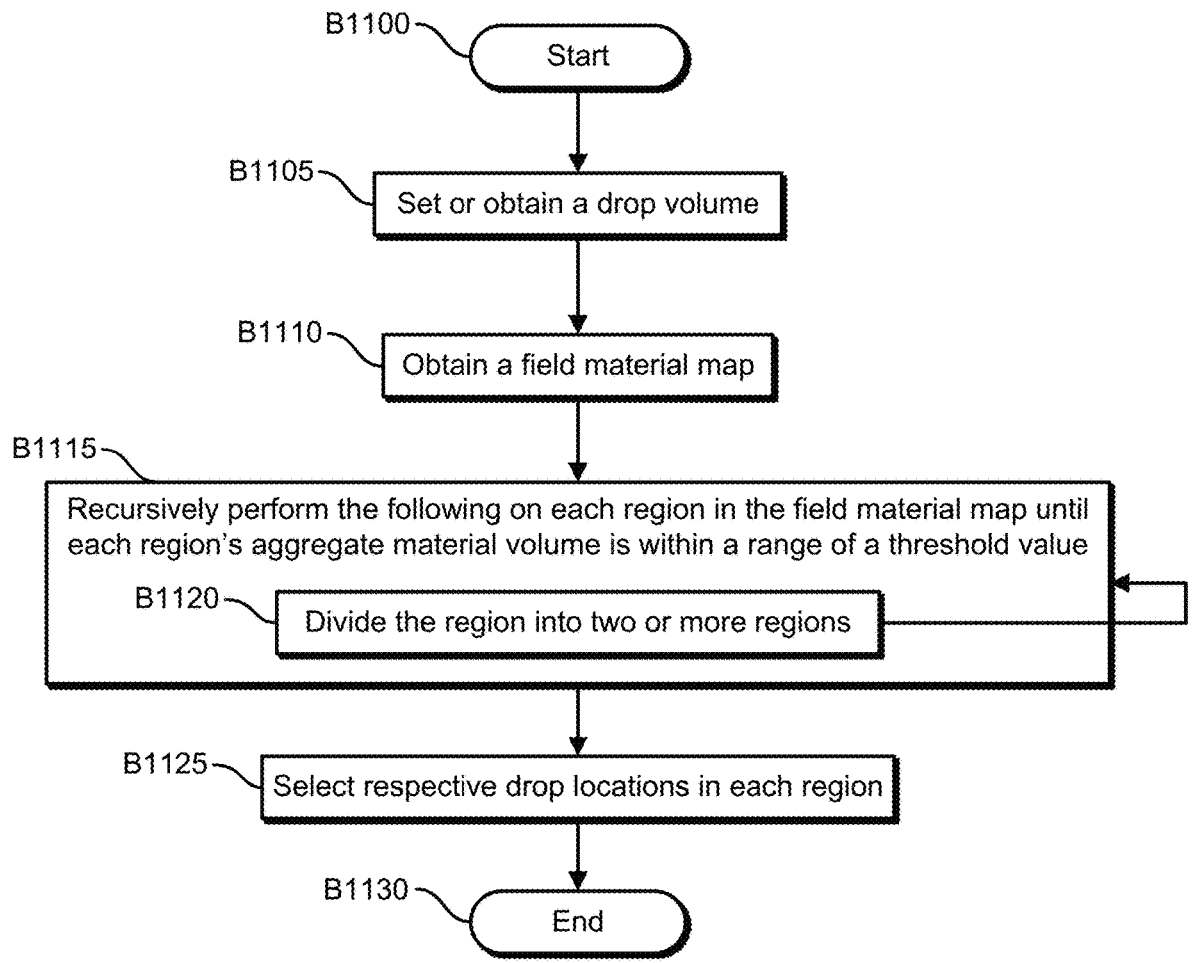
FIG. 11 illustrates an example embodiment of an operational flow for generating a drop pattern.

FIG. 11 illustrates an example embodiment of an operational flow for generating a drop pattern. The flow starts in block B1100 and then proceeds to block B1105, where a drop-pattern-generation device sets or obtains a drop volume. Then, in block B1110, the drop-pattern-generation device obtains a field material map.

Next, in block B1115, the drop-pattern-generation device recursively performs the operations in block B1120 for each region in the field material map until each region's aggregate material volume is within a range of a threshold value. Also, the first time that the drop-pattern-generation device performs the operations that are in block B1115, the region may be the entire field material map.

Next, in block B1120, the drop-pattern-generation device divides the region, that does not have an aggregate material volume that is within the range of the threshold value, into two or more regions. The drop-pattern-generation device may divide the region into two or more regions so that the respective aggregate material volumes in the two or more regions are approximately equal. For example, the drop-pattern-generation device may divide the region into two or more regions by selecting initial boundaries between the two or more regions and adjusting the boundaries until a satisfactory distribution of the aggregate material volumes of the two regions has been produced.

As noted above, the drop-pattern-generation device recursively performs the operations in blocks B1115 (including block B1120) for each region until the region's aggregate material volume is within a range of a threshold value. Thus, block B1120 may be performed for regions that were generated in previous iterations of block B1120.

The flow then proceeds to block B1125, where the drop-pattern-generation device selects respective drop locations in each region. Then the flow ends in block B1130.

Figure 12:
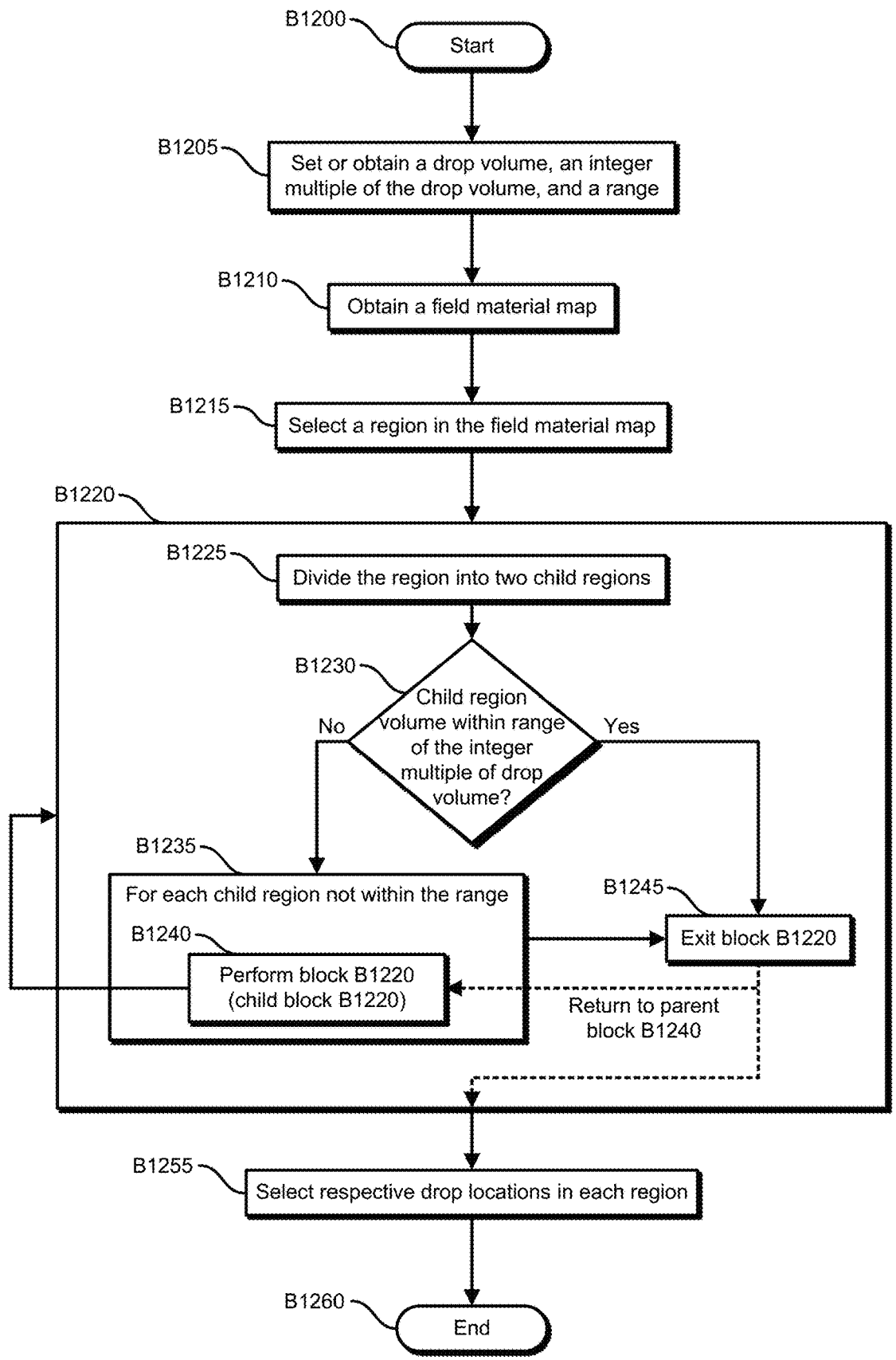
FIG. 12 illustrates an example embodiment of an operational flow for generating a drop pattern.

FIG. 12 illustrates an example embodiment of an operational flow for generating a drop pattern. The flow starts in block B1200 and then proceeds to block B1205, where a drop-pattern-generation device sets or obtains a drop volume, sets or obtains an integer multiple of the drop volume, and sets or obtains a range. Next, in block B1210, the drop-pattern-generation device obtains a field material map. The flow then proceeds to block B1215, where the drop-pattern-generation device selects a region in the field material map. In block B1215, the region may be the entire field material map.

The flow then advances to block B1220. Block B1220 includes blocks B1225-B1245. In block B1225, the drop-pattern-generation device divides the region into two child regions. For example, the drop-pattern generation device may divide the region into two equally sized (according to the number of tiles in the field material map), or approximately equally sized, regions. Also, for example, the drop-pattern generation device may divide the region into two regions that have equal, or approximately equal, aggregate material volumes. Additionally, the region is the parent region of the two child regions that are generated in block B1225.

Also, in embodiments where the drop-pattern-generation device alternates between horizontal division and vertical division, if the region was generated by a horizontal division (e.g., in a previous performance of block B1225), then the drop-pattern-generation performs a vertical division of the region in block B1225 (e.g., as shown in FIGS. 6A and 7B). And, if the region was generated by a vertical division (e.g., in a previous performance of block B1225), then the drop-pattern-generation device performs a horizontal division of the region in block B1225 (e.g., as shown in FIGS. 6B and 7A). In some embodiments, in the first performance of block B1225, the drop-pattern-generation device may be set to perform a horizontal division, or, alternatively, a vertical division. And some embodiments of the drop-pattern-generation device select a horizontal division or, alternatively, a vertical division for the first division based on the features or the properties of the field material map (e.g., size, aspect ratio).

The flow then moves to block B1230, where the drop-pattern-generation device determines whether the aggregate material volume of each of the child regions that was generated in block B1225 is within the range of the integer multiple of the drop volume. For example, some embodiments of the drop-pattern-generation device determine if $a \leq (m \times v) + r$, where the child region's aggregate material volume is a, where the integer multiple is m, where the drop volume is v, and where the range is r. Also, in embodiments where the region is divided into two child regions that have equal or approximately equal aggregate material volumes, the results of block B1230 may often or always be the same for both child regions.

If the drop-pattern-generation device determines that the respective aggregate material volume of both child regions is within the range of the integer multiple of the drop volume (block B1230=Yes), then the flow moves to block B1245. If the drop-pattern-generation device determines that the respective aggregate material volume of at least one child region is not within the range of the integer multiple of the drop volume (block B1230=No), then the flow moves to block B1235.

In block B1235, for each child region that has an aggregate material volume that is not within the range of the integer multiple of the drop volume, the drop-pattern-generation device performs block B1240. In block B1240, the drop-pattern-generation device performs the operations in block B1220 for the respective child region. When block B1220 is performed in block B1240, the block B1220 may be referred to herein as a "child block B1220," and a block B1240 that includes a child block B1220 may be referred to herein as a "parent block B1240." After all performances of block B1240 in block B1235, the flow moves to block B1245.

In block B1245, the drop-pattern-generation device exits block B1220. If block B1220 is being performed in a parent block B1240, the flow then returns to the parent block B1240. If the block B1220 does not have a parent block B1240, the flow then moves to block B1255.

In block B1255, the drop-pattern-generation device selects respective drop locations in each region that is not a parent region (i.e., does not have any child regions). Thus, for example, the drop-pattern-generation device selects respective drop locations in child regions that are not also parent regions (in child regions that were not further divided into more child regions). Also, the number of drop locations in each region may be equal to the integer multiple (m) of the drop volume. Then the flow ends in block B1260.

Figure 13:
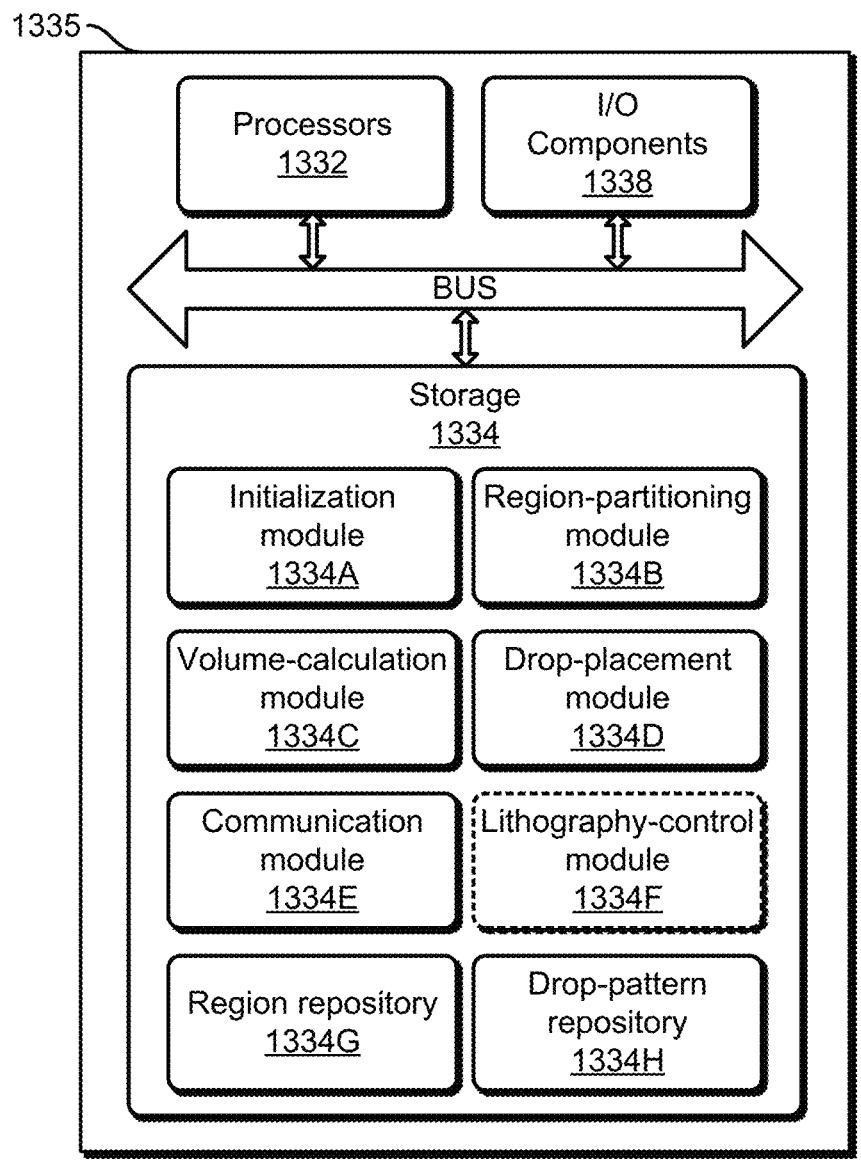
FIG. 13 illustrates an example embodiment of a drop-pattern-generation device.

FIG. 13 illustrates an example embodiment of a drop-pattern-generation device. The drop-pattern-generation device 1335 includes one or more processors 1332, one or more I/O components 1338, and storage 1334. Also, the hardware components of the drop-pattern-generation device 1335 communicate via one or more buses or other electrical connections. Examples of buses include a universal serial bus (USB), an IEEE 1394 bus, a Peripheral Component Interconnect (PCI) bus, a Peripheral Component Interconnect Express (PCIe) bus, an Accelerated Graphics Port (AGP) bus, a Serial AT Attachment (SATA) bus, and a Small Computer System Interface (SCSI) bus.

The one or more processors 1332 include one or more central processing units (CPUs), which may include microprocessors (e.g., a single core microprocessor, a multi-core microprocessor); one or more graphics processing units (GPUs); one or more tensor processing units (TPUs); one or more application-specific integrated circuits (ASICs); one or more field-programmable-gate arrays (FPGAs); one or more digital signal processors (DSPs); or other electronic circuitry (e.g., other integrated circuits). The I/O components 1338 may include communication components that communicate with one or more of the following: a nanoimprint-lithography-control device, a substrate-positioning stage, an imprint head, a fluid dispenser, an energy source, and a camera. Also, the I/O components 1338 may include communication components (e.g., a graphics card, a network-interface controller) that communicate with a network or with other input or output devices (not illustrated), which may include a display device, a keyboard, a mouse, a printing device, a touch screen, a light pen, an optical-storage device, a scanner, a microphone, a drive, and a controller (e.g., a joystick, a control pad).

The storage 1334 includes one or more computer-readable storage media. As used herein, a computer-readable storage medium includes an article of manufacture, for example a magnetic disk (e.g., a floppy disk, a hard disk), an optical disc (e.g., a CD, a DVD, a Blu-ray), a magneto-optical disk, magnetic tape, and semiconductor memory (e.g., a non-volatile memory card, flash memory, a solid-state drive, SRAM, DRAM, EPROM, EEPROM). The storage 1334, which may include both ROM and RAM, can store computer-readable data or computer-executable instructions.

The drop-pattern-generation device 1335 also includes an initialization module 1334A, a region-partitioning module 1334B, a volume-calculation module 1334C, a drop-placement module 1334D, and a communication module 1334E. Also, some embodiments of the drop-pattern-generation device 1335 include a lithography-control module 1334F. A module includes logic, computer-readable data, or computer-executable instructions. In the embodiment shown in FIG. 13, the modules are implemented in software (e.g., Assembly, C, C++, C #, Java, BASIC, Perl, Visual Basic). However, in some embodiments, the modules are implemented in hardware (e.g., customized circuitry) or, alternatively, a combination of software and hardware. When the modules are implemented, at least in part, in software, then the software can be stored in the storage 1334. Also, some embodiments of the drop-pattern-generation device 1335 include additional modules, omit some of these modules, combine these modules into fewer modules, or divide these modules into more modules. Additionally, the drop-pattern-generation device 1335 includes a region repository 1334G and a drop-pattern repository 1334H. The region repository 1334G stores generated regions (e.g., as K-D trees), and the drop-pattern repository 1334H stores drop patterns.

The initialization module 1334A includes instructions that cause the drop-pattern-generation device 1335 to set or obtain a drop volume, obtain a field material map, set or obtain an integer multiple of a drop volume, set or obtain a range, or initialize variables. For example, some embodiments of the initialization module 1334A include instructions that cause the drop-pattern-generation device 1335 to perform at least some of the operations that are described in blocks B405-B410 in FIG. 4, in blocks B905-B910 in FIG. 9, in blocks B1105-B1110 in FIG. 11, or in blocks B1205-B1210 in FIG. 12.

The region-partitioning module 1334B includes instructions that cause the drop-pattern-generation device 1335 to partition regions in a field material map into two respective regions. For example, some embodiments of the region-partitioning module 1334B include instructions that cause the drop-pattern-generation device 1335 to perform at least some of the operations that are described in blocks B415-B425 in FIG. 4, in blocks B920-B965 in FIG. 9, in blocks B1115-B1120 in FIG. 11, or in blocks B1215-B1245 in FIG. 12. Also, some embodiments of the region-partitioning module 1334B call the volume-calculation module 1334C.

The volume-calculation module 1334C includes instructions that cause the drop-pattern-generation device 1335 to calculate marginal sums of formable-material volumes in a region in a field material map or to calculate the aggregate formable-material volume in a region in a field material map. For example, some embodiments of the volume-calculation module 1334C include instructions that cause the drop-pattern-generation device 1335 to perform at least some of the operations that are described in block B420 in FIG. 4; in blocks B920, B940, and B950 in FIG. 9; in block B1115 in FIG. 11; or in block B1230 in FIG. 12.

The drop-placement module 1334D includes instructions that cause the drop-pattern-generation device 1335 to determine respective drop locations of drops in one or more regions and to generate drop patterns based on the drop locations. For example, some embodiments of the drop-placement module 1334D include instructions that cause the drop-pattern-generation device 1335 to perform at least some of the operations that are described in block B430 in FIG. 4, in block B970 in FIG. 9, in block B1125 in FIG. 11, or in block B1255 in FIG. 12.

The communication module 1334E includes instructions that cause the drop-pattern-generation device 1335 to communicate with one or more other devices (e.g., a nanoimprint-lithography-control device, a substrate-positioning stage, an imprint head, a fluid dispenser, an energy source, a camera, a monitor, another computing device).

The lithography-control module 1334F includes instructions that cause the drop-pattern-generation device 1335 to regulate, control, or direct other components or subsystems of a nanoimprint lithography system, such as a substrate-positioning stage, an imprint head, a fluid dispenser, an energy source, and a camera. Thus, some embodiments of the drop-pattern-generation device 1335 that include the lithography-control module 1334F can also operate as a nanoimprint-lithography-control device.

At least some of the above-described devices, systems, and methods can be implemented, at least in part, by providing one or more computer-readable media that contain computer-executable instructions for realizing the above-described operations to one or more computing devices that are configured to read and execute the computer-executable instructions. The systems or devices perform the operations of the above-described embodiments when executing the computer-executable instructions. Also, an operating system on the one or more systems or devices may implement at least some of the operations of the above-described embodiments.

Furthermore, some embodiments use one or more functional units to implement the above-described devices, systems, and methods. The functional units may be implemented in only hardware (e.g., customized circuitry) or in a combination of software and hardware (e.g., a microprocessor that executes software).

The invention claimed is:

1. A method comprising:
   (a) receiving a field material map that represents a spatial distribution of a volume of a material over a rectangular region;
   (b) dividing the rectangular region into two rectangular child regions along a division axis, wherein material volumes of the two rectangular child regions are approximately equal;
   (c) determining if the material volume in each rectangular child region is within a range of a specific volume;
   (d) for each rectangular child region that is not within the range of the specific volume, performing (b) for each rectangular child region as the rectangular region along a division axis that has been rotated by 90 degrees relative to the division axis that was used to generate the rectangular child region;
   (e) repeating (b)-(d) until all rectangular child regions meet the criteria in (c);
   (f) generating a drop pattern that includes one or more drop locations inside each rectangular child region that meets the criteria in (c); and
   (g) depositing formable material on a substrate in accordance with the drop pattern.

2. The method of claim 1,
   wherein the drop pattern includes two or more drop locations inside each rectangular child region that meets the criteria in (c), and
   wherein a respective orientation of the two or more drop locations inside each rectangular child region takes into account a directionality of one or more of a template and the substrate.

3. The method of claim 1, wherein the field material map includes a plurality of tiles, wherein each tile has a respective material volume, and wherein each tile has a width that is a tenth of a radius of a drop.

4. The method of claim 1, wherein the specific volume is an integer multiple of a drop volume.

5. The method of claim 1, wherein a respective center of each region includes a respective drop location.

6. The method of claim 1, wherein dividing the rectangular region into two rectangular child regions along a division axis includes calculating marginal sums of the material volume in the rectangular region.

7. The method of claim 1, further comprising:
   imprinting the formable material on the substrate with a template; and
   manufacturing an article by processing the substrate on which the formable material has been imprinted.

8. A device comprising:
   one or more computer-readable media; and
   one or more processors in communication with the one or more computer-readable media, wherein the one or more processors and the one or more computer-readable media are configured to cause the device to:
   obtain a field material map;
   divide a region in the field material map into two child regions;
   determine that a respective material volume of each of the two child regions is not within a range of a threshold volume;
   in response to determining that the respective material volume of each of the two regions is not within the range of the threshold volume,
      divide each of the two child regions into two additional respective child regions,
      determine that a respective material volume of each of the additional respective child regions is within the range of the threshold volume, and
      in response to determining that the respective material volume of each of the additional respective child regions is within the range of the threshold volume, generating a drop pattern that includes one or more drop locations in each of the additional respective child regions; and
   instruct a fluid dispenser to deposit drops of formable material on a substrate in accordance with the drop pattern.

9. The device of claim 8, wherein the drop pattern includes an equal number of drop locations in each of the additional respective child regions.

10. The device of claim 8, wherein the one or more processors and the one or more computer-readable media are further configured to cause the device to generate the region in the field material map by dividing a larger region into the region and another region.

11. The device of claim 8, wherein the respective material volumes of each of the additional respective child regions are equal or approximately equal to each other.

12. The device of claim 11, wherein the one or more processors and the one or more computer-readable media are further configured to cause the device to:
   obtain a drop volume,
   wherein the respective material volumes of each of the additional respective child regions are also equal or approximately equal to an integer multiple of the drop volume.

13. The device of claim 8, wherein, to divide each of the two child regions into the two additional respective child regions, the one or more processors and the one or more computer-readable media are further configured to cause the device to calculate marginal sums of the respective material volumes of the two child regions.

14. The device of claim 8, wherein, to divide the region in the field material map into the two child regions, the one or more processors and the one or more computer-readable media are further configured to cause the device to divide the region in the field material map into the two child regions along a first axis, and wherein, to divide each of the two child regions into the two additional respective child regions, the one or more processors and the one or more computer-readable media are further configured to cause the device to divide each of the two child regions into the two additional respective child regions along a second axis that is perpendicular to the first axis.

15. One or more computer-readable storage media storing instructions that, when executed by one or more computing devices, cause the one or more computing devices to perform operations comprising:
    obtaining a field material map;
    dividing the field material map into two regions;
    recursively dividing the two regions into more regions, wherein each recursive dividing generates two respective child regions from a respective parent region, until a respective material volume of each child region that is not also a parent region is within a range of a specified volume;
    generating a drop pattern that includes one or more respective drop locations in each of the child regions that is not also a parent region; and
    instructing a fluid dispenser to deposit drops of formable material on a substrate in accordance with the drop pattern.

16. The one or more computer-readable storage media of claim 15, wherein the operations further comprise:
    obtaining a drop volume,
    wherein the specified volume is an integer multiple of the drop volume.

17. The one or more computer-readable storage media of claim 15, wherein recursively dividing the two regions into more regions includes calculating marginal sums of material volumes in the two regions.

18. The one or more computer-readable storage media of claim 15, wherein at least some regions are both a child region and a parent region.

19. The one or more computer-readable storage media of claim 15, wherein the drop pattern includes two or more respective drop locations in each of the child regions that is not also a parent region, and wherein the two or more respective drop locations in each child region are isotropic.

20. The one or more computer-readable storage media of claim 15, wherein the drop pattern includes two or more respective drop locations in each of the child regions that is not also a parent region, and wherein the two or more respective drop locations in each child region are anisotropic.

* * * * *